US012578686B2

(12) United States Patent
Matsumoto

(10) Patent No.: US 12,578,686 B2
(45) Date of Patent: Mar. 17, 2026

(54) ATOMIC OSCILLATOR

(71) Applicant: NEC Corporation, Tokyo (JP)

(72) Inventor: Kenta Matsumoto, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 18/758,013

(22) Filed: Jun. 28, 2024

(65) Prior Publication Data

US 2025/0023519 A1 Jan. 16, 2025

(30) Foreign Application Priority Data

Jul. 12, 2023 (JP) ................................. 2023-114669

(51) Int. Cl.
G04F 5/14 (2006.01)
H03B 17/00 (2006.01)
H03L 7/26 (2006.01)

(52) U.S. Cl.
CPC ................ G04F 5/14 (2013.01); G04F 5/145 (2013.01); H03B 17/00 (2013.01); H03L 7/26 (2013.01)

(58) Field of Classification Search
CPC ............... H03L 7/26; G04F 5/145; G04F 5/14
See application file for complete search history.

(56) References Cited

U.S. PATENT DOCUMENTS

2013/0176081 A1* 7/2013 Nishida .................... H03L 7/26
331/94.1
2017/0219852 A1* 8/2017 Nishida ................ H01S 5/0687

FOREIGN PATENT DOCUMENTS

JP 2020-065148 A 4/2020

* cited by examiner

*Primary Examiner* — Ryan Johnson
(74) *Attorney, Agent, or Firm* — Sughrue Mion, PLLC

(57) ABSTRACT

An atomic oscillator of the present disclosure includes: a gas cell in which alkali metal atoms are encapsulated; a light generator that irradiates the gas cell with irradiation light having at least two different frequency components; a light detector that detects transmission light transmitted by the gas cell; and a controller that determines the resonance frequency of the irradiation light based on the light amount of the detected transmission light, and controls an oscillation frequency based on the determined resonance frequency. The controller determines the state of the atomic oscillator based on a control signal output when controlling the oscillation frequency.

10 Claims, 7 Drawing Sheets

Fig.1

2-1   AMOUNT OF TRANSMISSION LIGHT

RESONANCE FREQUENCY

FREQUENCY DIFFERENCE 2-2   ERROR SIGNAL

ZERO-CROSSING: RESONANCE FREQUENCY

FREQUENCY DIFFERENCE 3-1

3-2

4-1

OUTPUT FREQUENCY CHANGE [Hz]

ELAPSED TIME 4-2

CONTROL VOLTAGE OF OSCILLATION DEVICE [V]

VCTCXO_vc_Raw

ELAPSED TIME 5-1

5-2

5-3

ATOMIC OSCILLATOR

INCORPORATION BY REFERENCE

This application is based upon and claims the benefit of priority from Japanese patent application No. 2023-114669, filed on Jul. 12, 2023, the disclosure of which is incorporated herein in its entirety by reference.

TECHNICAL FIELD

The present disclosure relates to an atomic oscillator.

BACKGROUND ART

As an oscillator with long-term high-precision oscillation characteristics, an atomic oscillator that oscillates based on the energy transition of alkali metal atoms is known. The atomic oscillator determines a resonance frequency by detecting the transmission light amount of light applied to the atoms and controls an oscillation frequency based on the resonance frequency. Then, the atomic oscillator needs to increase the stability of the oscillation frequency. For example, Patent Literature 1 describes that the result of detection of transmission light is fed back.

Patent Literature 1: Japanese Unexamined Patent Application Publication No. JP-A 2020-065148

Here, in a case where an anomaly in the oscillation frequency occurs in an atomic oscillator, initialization including determination of a resonance frequency is performed to increase the stability of the oscillation frequency. However, in order to detect an anomaly in the oscillation frequency, an external oscillation source which is more stable is required. This causes a problem that it is difficult to detect an anomaly in the atomic oscillator.

SUMMARY OF THE INVENTION

An object of the present disclosure is to provide an atomic oscillator which can solve the abovementioned problem that it is difficult to detect an anomaly in the atomic oscillator.

An atomic oscillator as an aspect of the present invention includes: a gas cell in which alkali metal atoms are encapsulated; a light generator that irradiates the gas cell with irradiation light having at least two different frequency components; a light detector that detects transmission light transmitted by the gas cell; and a controller that determines a resonance frequency of the irradiation light based on a light amount of the detected transmission light, and controls an oscillation frequency based on the determined resonance frequency. The controller determines a state of the atomic oscillator based on a control signal output when controlling the oscillation frequency.

Further, a control method as an aspect of the present invention is a control method for controlling an atomic oscillator. The atomic oscillator includes: a gas cell in which alkali metal atoms are encapsulated; a light generator that irradiates the gas cell with irradiation light having at least two different frequency components; a light detector that detects transmission light transmitted by the gas cell; and a controller that determines a resonance frequency of the irradiation light based on a light amount of the detected transmission light and controls an oscillation frequency based on the determined resonance frequency. The control method includes determining a state of the atomic oscillator based on a control signal output when controlling the oscillation frequency.

Further, a control device as an aspect of the present invention is a control device of an atomic oscillator. The atomic oscillator includes: a gas cell in which alkali metal atoms are encapsulated; a light generator that irradiates the gas cell with irradiation light having at least two different frequency components; a light detector that detects transmission light transmitted by the gas cell; and the control device that determines a resonance frequency of the irradiation light based on a light amount of the detected transmission light and controls an oscillation frequency based on the determined resonance frequency. The control device determines a state of the atomic oscillator based on a control signal output when controlling the oscillation frequency.

Further, a computer program as an aspect of the present invention includes instructions for causing a control device of an atomic oscillator to execute processes. The atomic oscillator includes: a gas cell in which alkali metal atoms are encapsulated; a light generator that irradiates the gas cell with irradiation light having at least two different frequency components; a light detector that detects transmission light transmitted by the gas cell; and the control device that determines a resonance frequency of the irradiation light based on a light amount of the detected transmission light and controls an oscillation frequency based on the determined resonance frequency. The computer program includes instructions for causing the control device to execute processes to determine a state of the atomic oscillator based on a control signal output when controlling the oscillation frequency.

With the configurations as described above, the present disclosure can facilitate detection of an anomaly in an atomic oscillator.

BRIEF DESCRIPTION OF DRAWINGS

FIG. 1 is a block diagram showing the configuration of an atomic oscillator in the present disclosure;

EXAMPLE EMBODIMENTS

First Example Embodiment

A first example embodiment of the present disclosure will be described with reference to the drawings. The drawings can relate to any of the example embodiments.

[Configuration]

Figure 2:
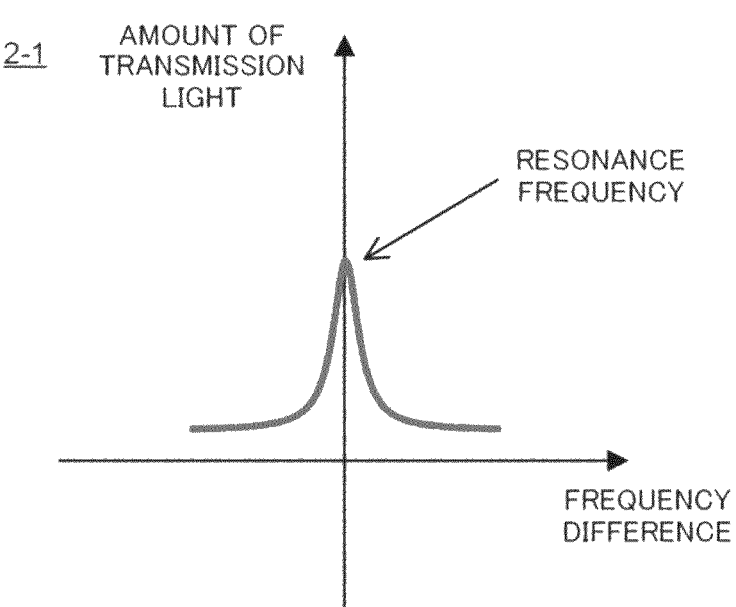
FIG. 2 is a view showing an aspect of processing by the atomic oscillator.
Figure 2:
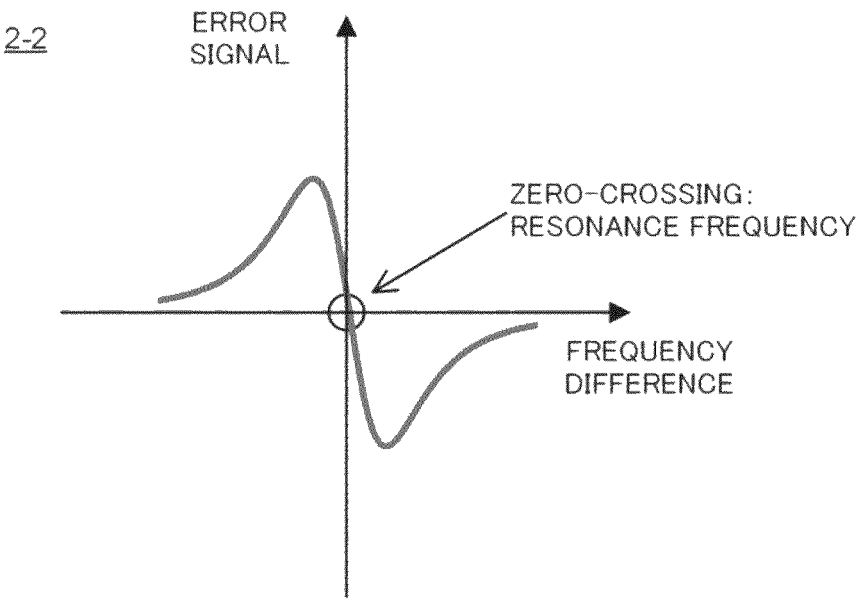

First, the outline of an atomic oscillator will be described. An atomic oscillator is a device that realizes stable frequency oscillation by utilizing an atomic gas of alkali metal atoms and the like. An atomic oscillator has a gas cell in which an atomic gas is encapsulated. By irradiating the gas cell with light containing at least two different frequencies and measuring transmission light thereof, the atomic oscillator can detect a quantum interference effect (called CPT (Coherent Population Trapping) resonance) that occurs when the transition frequency between specific quantum states of the atomic gas matches the frequency difference of the irradiation light, as a change of the amount of transmission light. FIG. 2 is a view of the CPT resonance appearing in a transmission light spectrum. For example, in the case of measuring a transmission light spectrum when light transmitted by cesium atoms is detected while sweeping the frequency difference of irradiation light, when the frequency difference matches the transition frequency between specific quantum states, the amount of the transmission light reaches a peak value and CPT resonance is detected as shown in FIG. 2 (2-1). The frequency difference of the irradiation light at this time is called a resonance frequency. By detecting the resonance frequency of the CPT resonance and controlling the frequency difference of the irradiation light to match the transition frequency between the specific quantum states, a high-precision atomic oscillator utilizing the quantum interference effect can be realized. In the atomic oscillator utilizing CPT described above, the resonance frequency of the CPT resonance is used as the reference for the oscillation frequency.

A transmission light spectrum is expressed as a Lorentzian function centered on the transition frequency between quantum states, where a point at which the amount of transmission light is maximized is generally the resonance frequency of the CPT resonance and used as the reference for the oscillation frequency. As an example, by sweeping the frequency difference of light applied at the time of starting the atomic oscillator, it is possible to acquire an error signal of a transmission light spectrum as shown in a schematic view of FIG. 2 (2-2), and set the zero-crossing of the error signal as the resonance frequency and set as the reference for the oscillation frequency. The error signal of the transmission light spectrum can be acquired, for example, by modulating the frequency difference of the irradiation light with a reference frequency of a period shorter than the sweep period of the frequency difference at the time of sweeping the frequency difference, and performing lock-in detection on the detected amount of transmission light with the reference frequency.

Figure 3:
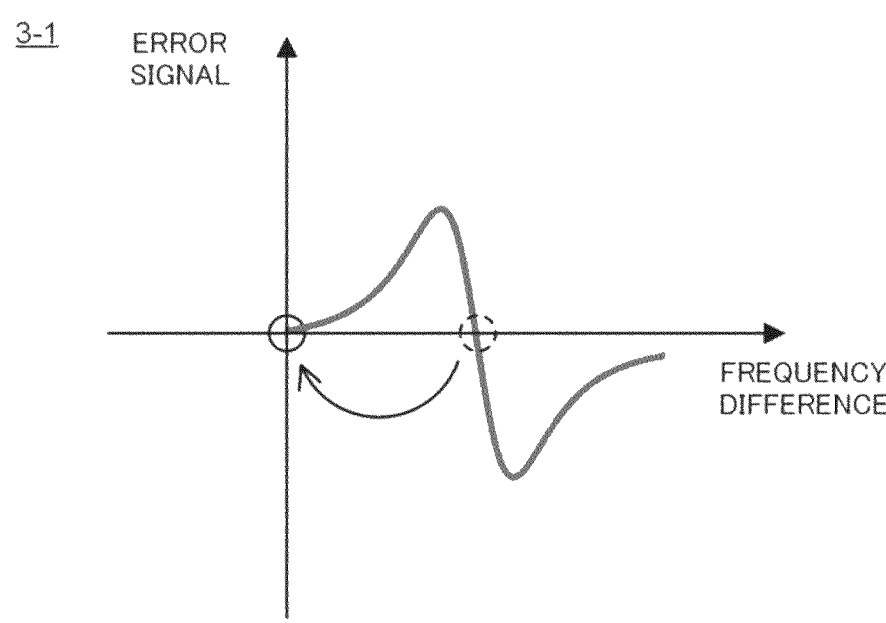
FIG. 3 is a view showing an aspect of processing by the atomic oscillator.
Figure 3:
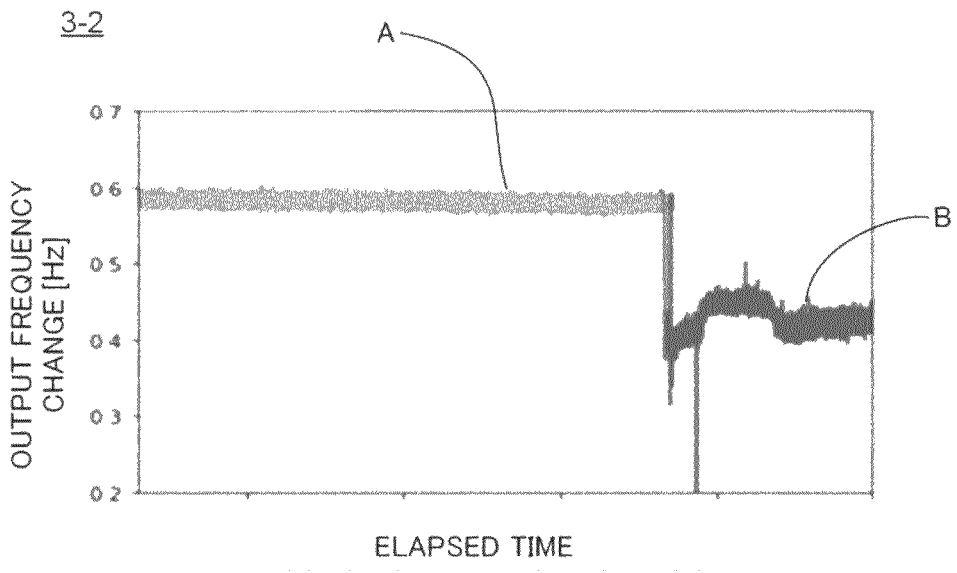

Then, after detecting the resonance frequency using the zero-crossing in the above manner as an initialization process, the atomic oscillator constantly monitors the zero-crossing and feeds back by the amount of deviation from the zero-crossing to the control signal of an oscillation device, and can thereby increase the stability of an output frequency as indicated by symbol A in FIG. 3 (3-2). On the other hand, when the resonance signal becomes small relative to the noise level, the atomic oscillator may monitor a point where there is no resonance signal as the zero crossing as shown in FIG. 3 (3-1). Then, as indicated by symbol B in FIG. 3 (3-2), the output frequency may change significantly, resulting in an anomalous state. Such an anomalous state can be detected by monitoring the output frequency, but monitoring requires a more reliable external oscillation source, which is difficult to realize.

Accordingly, in the present disclosure, the state of an atomic oscillator is determined by monitoring not the above-mentioned output frequency but another signal. The configuration of the atomic oscillator will be described below.

Figure 1:
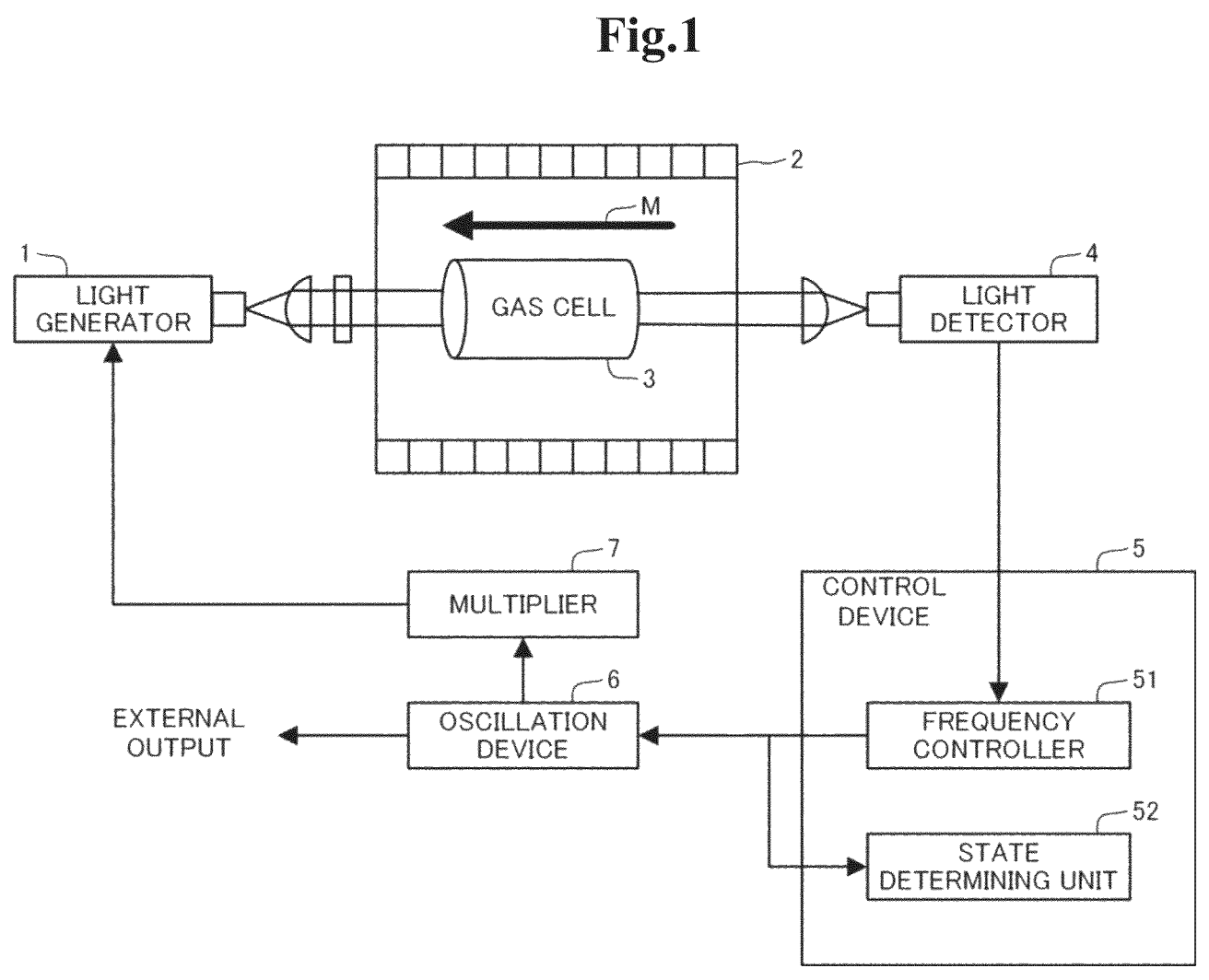

As shown in FIG. 1, the atomic oscillator includes a light generator 1, a magnetic field application device 2, a gas cell

3 in which alkali metal atoms or the like are encapsulated in the gaseous state, a light detector 4, a control device 5, an oscillation device 6, and a multiplier 7. The control device 5 is configured with an information processing device including an arithmetic logic unit and a memory unit. Then, the control device 5 includes a frequency controller 51 and a state determining unit 52 that are constructed by execution of a program by the arithmetic logic unit as shown in FIG. 1.

The light generator 1 generates light having at least two different frequencies. Irradiation light, which is the light generated by the light generator 1, is applied onto the gas cell 3, and transmission light, which is light transmitted by the gas cell 3, reaches the light detector 4 and is detected, converted into an electric signal or the like and sent to the control device 5. Moreover, the light generator 1 is configured so that the wavelength of light to be generated, the intensity of the light for each frequency component, and the frequency difference are controlled based on a control signal from the control device 5 as will be described later.

The irradiation light that is the light generated by the light generator 1 has at least two different frequency components. Although the light emitted by the light generator 1 may have three or more different frequency components, the frequency difference between two of the frequency components is approximately equal to the transition frequency between specific quantum states forming the CPT resonance of alkali metal atoms. For example, the light generated by the light generator 1 is realized by generating sidebands by modulating single-wavelength light oscillating from a semiconductor laser or the like with a frequency that is approximately equal to the transition frequency of an alkali metal atom or 1/N times the transition frequency, where N is an integer. At this time, the control of the frequency difference is realized by a mechanism that controls the modulation frequency. Alternatively, the light generated by the light generator 1 is realized by multiplexing two single-wavelength lights oscillating from two semiconductor lasers or the like having a mechanism controlling the frequency difference.

The magnetic field application device 2 generates a magnetic field M in a direction parallel or antiparallel to the irradiation light at a predetermined position inside the gas cell 3. The magnetic field application device 2 is, for example, a coil arranged to cover the gas cell 3, and the control of the direction and strength of a static magnetic field applied to a predetermined position inside the gas cell 3 is realized by regulating the direction and magnitude of an electric current applied to the coil.

In the gas cell 3, alkali metal atoms are encapsulated. The alkali metal atoms encapsulated in the gas cell 3 may be, for example, any of cesium atoms, rubidium atoms, sodium atoms, and potassium atoms. A material constituting the container of the gas cell 3 is preferably a transparent material such as glass that has a high transmittance for the irradiation light generated by the light generator 1. In the gas cell 3, in addition to the alkali metal atoms, a buffer gas that does not contribute to absorption of the irradiation light may be encapsulated in order to reduce the effect of collisions between the container wall surface and the gaseous alkali metal atoms. Moreover, the gas cell 3 may include a temperature control device that does not block the optical path of the irradiation light, for the purpose of controlling the saturated vapor pressure of the gaseous alkali metal atoms. For example, the temperature control device is configured with a resistance heater.

The light detector 4 has a device that detects transmission light, which is light transmitted by the gas cell 3. The light detector 4 is, for example, realized by using a photodiode, and can be realized by a photodetector that is a light detecting means. Information of the light detected by the light detector 4 is converted into an electric signal or the like and input to the control device 5.

As an initiation process at the time of starting the atomic oscillator and the like, the frequency controller 51 included by the control device 5 determines the resonance frequency in the abovementioned manner from the amount of the transmission light input by the light detector 4, and controls an oscillation frequency from the oscillation device 6 based on the determined resonance frequency. Specifically, the frequency controller 51 sweeps the frequency difference of the irradiation light, determines the resonance frequency from the transmission light spectrum, and, once determining the resonance frequency, regulates a control voltage for the oscillation device 6 so that the error signal of the lock-in detected transmission light spectrum is at a predetermined signal level. Here, the oscillation device 6 is configured with a VCXO (voltage controlled crystal oscillator) that oscillates at about 10 MHz, and the oscillation device 6 generates an oscillation signal in accordance with a control voltage output and applied by the frequency controller 51, and outputs the oscillation signal as an oscillation frequency that is the external output of the atomic oscillator. Consequently, the oscillation frequency is stabilized at 10 MHz as long as the resonance frequency does not change. Moreover, the frequency difference of the irradiation light is generated by converting the oscillation signal of the VCXO into a signal of several GHz by the multiplier 7 and is input to the light generator 1.

Figure 4:
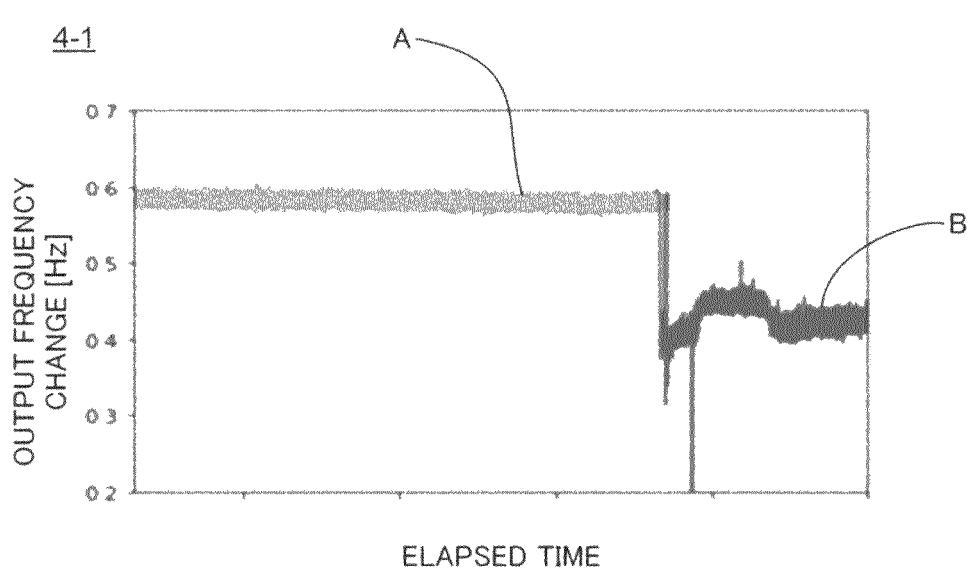
FIG. 4 is a view showing an aspect of processing by the atomic oscillator.
Figure 4:
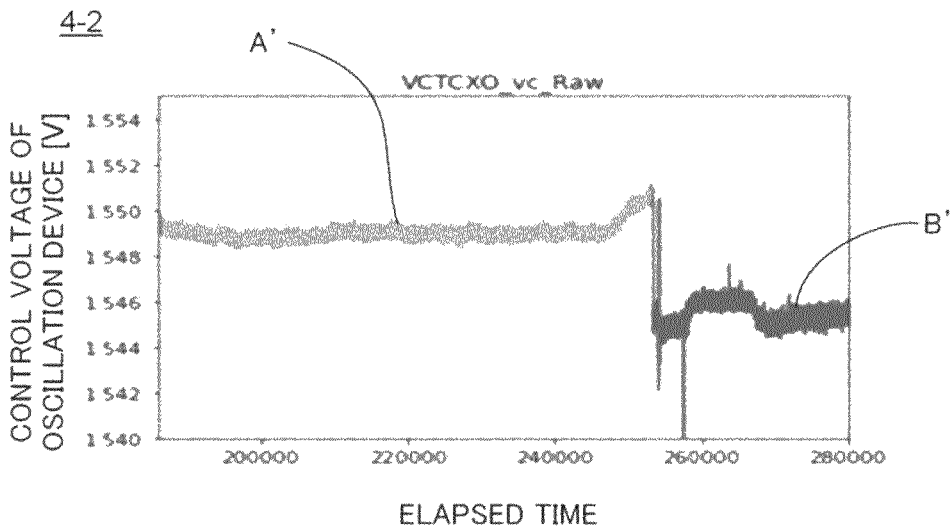

The state determining unit 52 included by the control device 5 acquires the control signal of the oscillation device 6 output by the frequency controller 51, and determines the state of the atomic oscillator based on the control signal. Specifically, the state determining unit 52 acquires a control voltage output to the oscillation device 6, and determines the state of the atomic oscillator in accordance with a change of the control voltage. FIG. 4 (4-1) shows a change over time of the output frequency of the oscillation signal output from the oscillation device 6, and FIG. 4 (4-2) shows a change over time of the control voltage for the oscillation device 6. Elapsed time on the horizontal axes in FIGS. 4 (4-1) and (4-2) are almost the same time of day, and FIG. 4 (4-1) shows an aspect that the output frequency is in a stable state as indicated by symbol A and then changes to come in an anomalous state indicated by symbol B, as described above. Looking at a change over time of the control voltage for the oscillation device 6 in FIG. 4 (4-2), in the same manner as in FIG. 4 (4-1), the control voltage is stable as indicated by symbol A' when the output frequency is stable, and the control voltage suddenly changes as indicated by symbol B' when the output frequency suddenly changes. For this reason, by detecting a sudden change of the control voltage for the oscillation device 6 as an anomalous state, it is possible to detect that the output frequency is in an anomalous state, and it is possible to determine that the atomic oscillator is in an anomalous state.

The state determining unit 52 detects the anomalous state of the control voltage by constantly acquiring the control voltage for the oscillation device 6 at regular time intervals and examining the change of the acquired control voltage relative to a past value. As an example, the state determining unit 52 examines a change amount f(t) of a control voltage value y(t) from the latest past moment (t−1) to the present time (t) as indicated by Equation 1 shown below and, in a case where, for example, the change amount exceeds a preset threshold value, detects as an anomalous state.

$$f(t) = y(t) - y(t - 1) \qquad \text{[Equation 1]}$$

Figure 5:
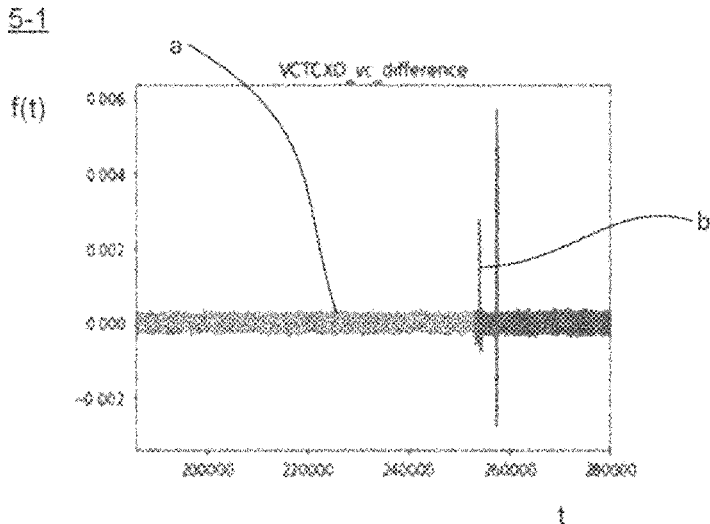
FIG. 5 is a view showing an aspect of processing by the atomic oscillator.
Figure 5:
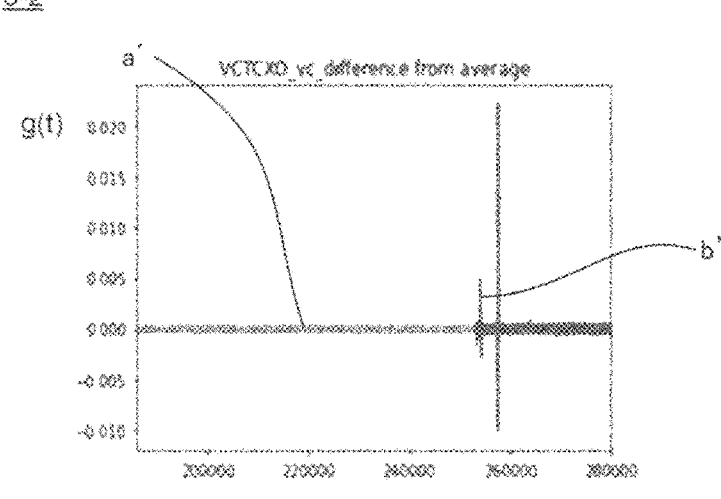
Figure 5:
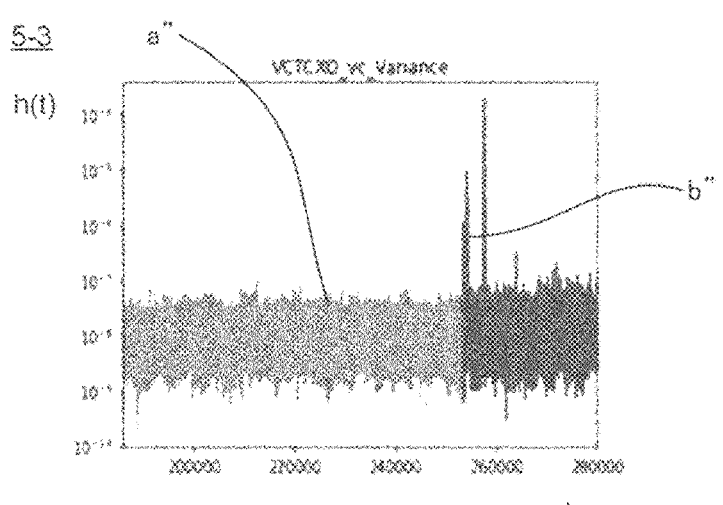

An example of the change amount f(t) at this time is shown in FIG. 5 (5-1). In this view, symbol a denotes a section in which the output frequency is stable, and symbol b denotes a section after sudden change of the output frequency. Since the change amount f(t) also suddenly changes in response, an anomalous state can be detected.

As another example, the state determining unit 52 acquires the control voltage for the oscillation device 6 at regular time intervals, retains values for a certain period of time, calculates a preset statistical value of the past values, and detects an anomalous state using this statistical value. As an example, the state determining unit 52 detects an anomalous state, for example, in a case where a change amount g(t) of a value at the present time (t) relative to the statistical value of the past values exceeds a preset threshold value. For example, the state determining unit 52 first calculates an average value of control voltages at the latest past nine points ((t−1) to (t−9)) as shown by Equation 2 shown below.

$$\bar{y}(t - 9; t - 1) = \sum_{i=1}^{9} \frac{y(t - l)}{9} \qquad \text{[Equation 2]}$$

Then, the state determining unit 52 examines the change amount g(t) of the control voltage y(t) at the present time (t) relative to the average value as shown by Equation 3 shown below and, in a case where, for example, the change amount exceeds a preset threshold value, detects an anomalous state.

$$g(t) = y(t) - \bar{y}(t - 9; t - 1) \qquad \text{[Equation 3]}$$

An example of the change amount g(t) at this time is shown in FIG. 5 (5-2). In this view, symbol a' indicates a section in which an output frequency is stable, and symbol b' indicates a section after sudden change of the output frequency. Since the change amount g(t) also changes suddenly in response, an anomalous state can be detected. Here, the average value may be calculated from the values at the latest past nine points, but may be the average value of values in any period. Moreover, the average value is used as the statistical value of past values to be compared with the present value, but any statistical value, such as the mode value in a predetermined past time period, may be used.

As another example, the state determining unit 52 acquires a control voltage for the oscillation device 6 at regular time intervals to retain values of a predetermined period, calculates a preset statistical value of the past values, and detects an anomalous state according to change of the statistical value. For example, as indicated by Equation 4 below, the state determining unit 52 calculates a variance h(t) of control voltage values (y(t)) at the latest past nine points including the present time (t) (from (t) to (t−9)) and, in a case where the value of the variance h(t) significantly changes, for example, exceeds a preset threshold value, detects as an anomalous state.

$$h(t) = \sum_{l=0}^{9} \frac{(y(t-l) - \bar{y}(t-9;t))^2}{10} \qquad \text{[Equation 4]}$$

An example of the abovementioned variance h(t) at this time is shown in FIG. 5 (5-3). In this view, symbol a" indicates a section in which an output frequency is stable, and symbol b" indicates a section after sudden change of the output frequency. Since the change amount h(t) also suddenly changes in response, an anomalous state can be detected. Here, the variance of the latest ten points is calculated, but the variance in any period may be calculated. Moreover, here, the variance is used as the statistical value, but another statistical value may be used.

Then, in the case of detecting the anomalous state of the control voltage as described above, the state determining unit 52 determines that the output frequency is in the anomalous state and the atomic oscillator is in the anomalous state, and outputs an alert for announcing such determination result. For example, the state determining unit 52 may be configured to output an alert to a control device of an apparatus on which the atomic oscillator is mounted so that the control device of the apparatus accordingly executes preset processing upon receiving the alert.

Further, the state determining unit 52 may perform an initialization process on the atomic oscillator in the case of determining that the atomic oscillator is in the anomalous state. The initialization process is a process at the time of starting the atomic oscillator, which is a process of sweeping the frequency of excitation light and determining the resonance frequency as described above.

[Operation]

Figure 6:
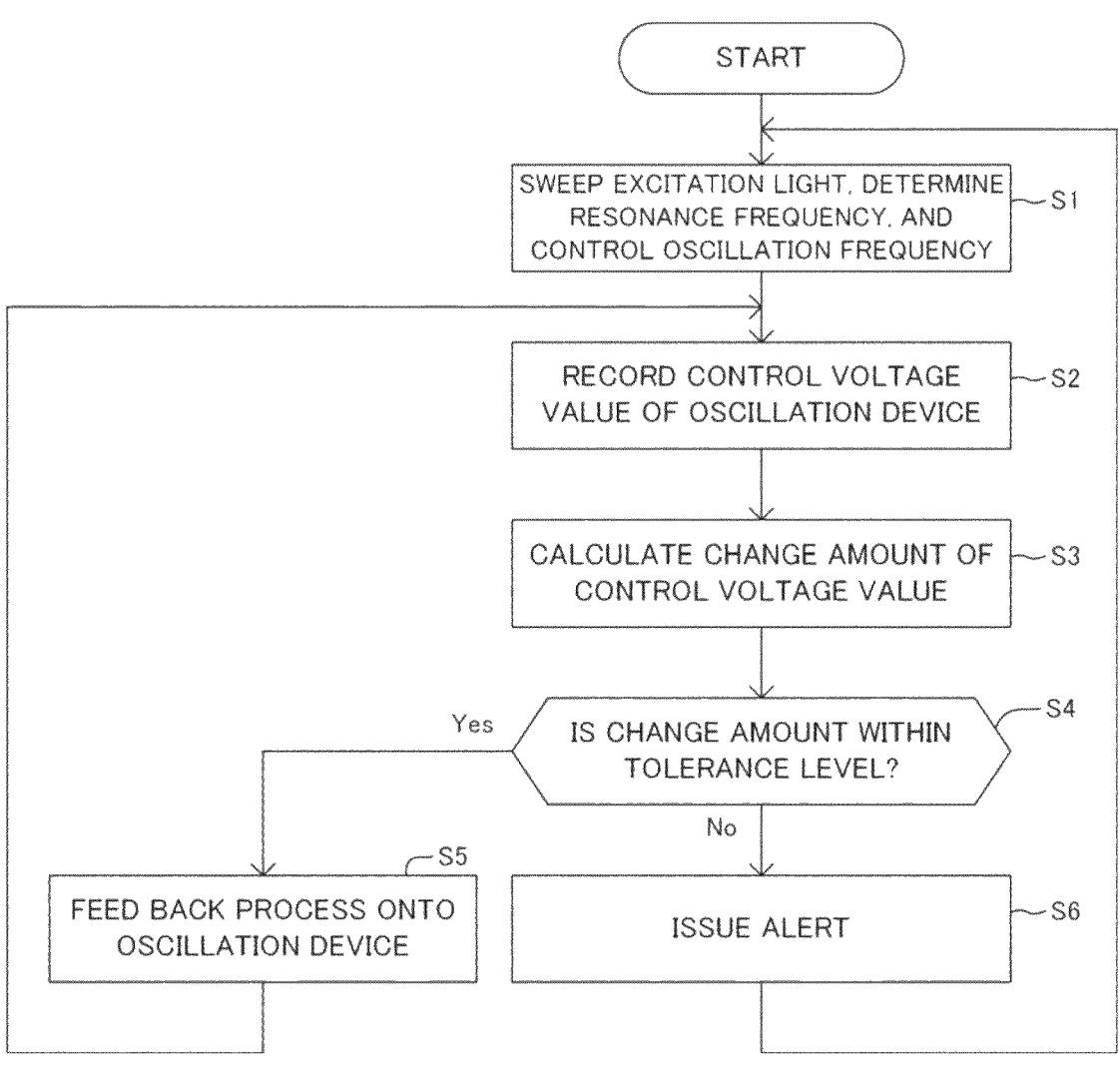
FIG. 6 is a flowchart showing processing operation by the atomic oscillator.

Next, the operation of the above atomic oscillator will be described. First, as an initialization process in starting the atomic oscillator, the control device 5 sweeps the frequency difference of excitation light generated by the light generator 1 in a predetermined range, and determines a resonance frequency from the amount of transmission light detected by the light detector 4. Then, in the control device 5, the frequency controller 51 controls an oscillation frequency by the oscillation device 6 based on the determined resonance frequency (step S1 in FIG. 6).

Once determining the resonance frequency, the frequency controller 51 regulates a control voltage for the oscillation device 6 so that an error signal of the lock-in detected transmission light spectrum is at a predetermined signal level. At this time, the state determining unit 52 records the value of the control voltage for the oscillation device 6 by the frequency controller 51 (step S2 in FIG. 6), and calculates the amount of change of the control voltage value (step S3 in FIG. 6). For example, the state determining unit 52 calculates, as the amount of change of the control voltage value, a change amount f(t) of a control voltage value y(t) from the latest past moment (t−1) to the present time (t), a change amount g(t) of a control voltage value y(t) at the present time (t) relative to an average value in a predetermined past period, a variance h(h) in a predetermined period, or the like, as mentioned above.

Then, in a case where the change amount as mentioned above is within a tolerance level, for example, does not exceed a preset threshold value (Yes at step S4 in FIG. 6), the state determining unit 52 regulates the control voltage for the oscillation device 6 without change (step S5 in FIG. 6) and can thereby output the oscillation frequency with stability. On the other hand, in a case where the change amount as mentioned above is beyond the tolerance level, for example, exceeds the preset threshold value (No at step S4 in FIG. 6), the state determining unit 52 determines that the oscillation frequency by the oscillation device 6 is in the anomalous state and the atomic oscillator is in the anomalous state, and issues an alert (step S6 in FIG. 6). Then, in the case of determining that the atomic oscillator is in the anomalous state, the state determining unit 52 performs the initialization process on the atomic oscillator to sweep the frequency of the excitation light and again determine the resonance frequency as described above (return to step S1 in FIG. 6).

Thus, according to the atomic oscillator of the present disclosure, it is possible to acquire a control voltage, which is a control signal for the oscillation device 6 output by the frequency controller 51, detect based on the control voltage that the output frequency is anomalous, and thereby determine the state of the atomic oscillator. Therefore, without monitoring the output frequency in the atomic oscillator, it is possible to easily determine the state of the atomic oscillator.

Although a case of determining the state of the atomic oscillator based on a control voltage for the oscillation device 6 has been illustrated in the above description, the state of the atomic oscillator may be determined based on another control signal for the oscillation device 6, instead of the control voltage. Furthermore, the state of the atomic oscillator may be determined based on a control signal output when controlling the oscillation frequency to another device mounted on the atomic oscillator, instead of the control signal for the oscillation device 6. In this case, the control signal to be output when controlling the oscillation frequency is considered to correspond to the state of the output frequency, so that it is possible to determine an anomaly of the output frequency, namely, an anomalous state of the atomic oscillator in the same manner as described above.

Second Example Embodiment

Next, a second example embodiment of the present invention will be described with reference to FIG. 7.

Figure 7:
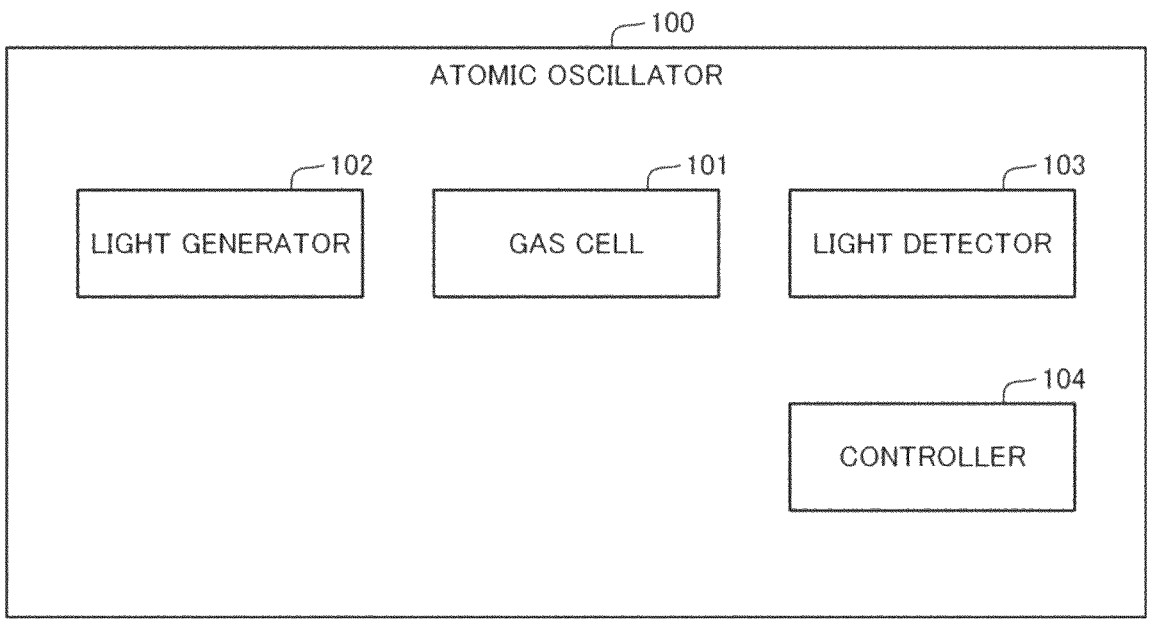
FIG. 7 is a block diagram showing the configuration of a second atomic oscillator in the present disclosure.

As shown in FIG. 7, an atomic oscillator 100 in this example embodiment includes:

a gas cell 101 in which alkali metal atoms are encapsulated;

a light generator 102 that irradiates the gas cell with irradiation light having at least two different frequency components;

a light detector 103 that detects transmission light transmitted by the gas cell; and a controller 104 that determines a resonance frequency of the irradiation light based on a light amount of the detected transmission light, and controls an oscillation frequency based on the determined resonance frequency.

The controller 104 determines a state of the atomic oscillator based on a control signal output when controlling the oscillation frequency.

Thus, by acquiring a control signal output when controlling an oscillation frequency, the atomic oscillator can determine the state of the atomic oscillator based on the control signal. Therefore, it is possible to easily determine the state of the atomic oscillator.

Although the present disclosure has been described above with reference to the above example embodiments and so forth, the present disclosure is not limited to the above example embodiments. The configuration of the present disclosure can be changed in various manners that can be understood by one skilled in the art within the scope of the present disclosure.

SUPPLEMENTARY NOTES

The whole or part of the example embodiments disclosed above can be described as the following supplementary notes. Below, the overview of the configurations of an atomic oscillator and a control method in the present disclosure will be described. However, the present invention is not limited to the following configurations.

Supplementary Note 1

An atomic oscillator comprising:

a gas cell in which alkali metal atoms are encapsulated;

a light generator that irradiates the gas cell with irradiation light having at least two different frequency components;

a light detector that detects transmission light transmitted by the gas cell; and a controller that determines a resonance frequency of the irradiation light based on a light amount of the detected transmission light and controls an oscillation frequency based on the determined resonance frequency, wherein the controller determines a state of the atomic oscillator based on a control signal output when controlling the oscillation frequency.

Supplementary Note 2

The atomic oscillator according to Supplementary Note 1, wherein the controller determines the state of the atomic oscillator based on a control signal to a device installed in the atomic oscillator, the control signal being output when controlling the oscillation frequency.

Supplementary Note 3

The atomic oscillator according to Supplementary Note 2, wherein the controller determines the state of the atomic oscillator based on a control voltage to an oscillation device that oscillates in response to a voltage applied thereto, the control voltage being output when controlling the oscillation frequency.

Supplementary Note 4

The atomic oscillator according to any of Supplementary Notes 1 to 3, wherein the controller determines the state of the atomic oscillator in accordance with change of a value based on the control signal.

Supplementary Note 5

The atomic oscillator according to Supplementary Note 4, wherein the controller determines the state of the atomic oscillator in accordance with change of the control signal relative to a past value of the control signal.

Supplementary Note 6

The atomic oscillator according to Supplementary Note 4, wherein the controller determines the state of the atomic oscillator in accordance with change of a statistical value of values of the control signal during a predetermined period of time.

Supplementary Note 7

A control method for controlling an atomic oscillator, the atomic oscillator including: a gas cell in which alkali metal atoms are encapsulated; a light generator that irradiates the gas cell with irradiation light having at least two different frequency components; a light detector that detects transmission light transmitted by the gas cell; and a controller that determines a resonance frequency of the irradiation light based on a light amount of the detected transmission light and controls an oscillation frequency based on the determined resonance frequency, the control method comprising determining a state of the atomic oscillator based on a control signal output when controlling the oscillation frequency.

Supplementary Note 8

The control method according to Supplementary Note 7, comprising determining the state of the atomic oscillator based on a control voltage to an oscillation device that oscillates in response to a voltage applied thereto, the control voltage being output when controlling the oscillation frequency.

Supplementary Note 9

The control method according to Supplementary Note 7, comprising determining the state of the atomic oscillator based on a control signal to a device installed in the atomic oscillator, the control signal being output when controlling the oscillation frequency.

Supplementary Note 10

The control method according to any of Supplementary Notes 7 to 9, comprising determining the state of the atomic oscillator in accordance with change of a value based on the control signal.

Supplementary Note 11

The control method according to Supplementary Note 10, comprising determining the state of the atomic oscillator in accordance with change of the control signal relative to a past value of the control signal.

Supplementary Note 12

The control method according to Supplementary Note 10, comprising determining the state of the atomic oscillator in accordance with change of a statistical value of values of the control signal during a predetermined period of time.

Supplementary Note 13

A control device of an atomic oscillator, the atomic oscillator including: a gas cell in which alkali metal atoms are encapsulated; a light generator that irradiates the gas cell with irradiation light having at least two different frequency components; a light detector that detects transmission light transmitted by the gas cell; and the control device that determines a resonance frequency of the irradiation light based on a light amount of the detected transmission light and controls an oscillation frequency based on the determined resonance frequency, the control device determining a state of the atomic oscillator based on a control signal output when controlling the oscillation frequency.

Supplementary Note 14

A computer program comprising instructions for causing a control device of an atomic oscillator to execute processes, the atomic oscillator including: a gas cell in which alkali metal atoms are encapsulated; a light generator that irradiates the gas cell with irradiation light having at least two different frequency components; a light detector that detects transmission light transmitted by the gas cell; and the control device that determines a resonance frequency of the irradiation light based on a light amount of the detected transmission light and controls an oscillation frequency based on the determined resonance frequency, the computer program comprising instructions for causing the control device to execute processes to determine a state of the atomic oscillator based on a control signal output when controlling the oscillation frequency.

DESCRIPTION OF REFERENCE NUMERALS

1 light generator
2 magnetic field application device
3 gas cell
4 light detector
5 control device
51 frequency controller
52 state determining unit
6 oscillation device
7 multiplier
100 atomic oscillator
101 gas cell
102 light generator
103 light detector
104 controller

The invention claimed is:

1. An atomic oscillator comprising:
a gas cell in which alkali metal atoms are encapsulated;
a light generator that irradiates the gas cell with irradiation light having at least two different frequency components;
a light detector that detects transmission light transmitted by the gas cell; and
a controller that determines a resonance frequency of the irradiation light based on a light amount of the detected transmission light and controls an oscillation frequency based on the determined resonance frequency,
wherein the controller determines a state of the atomic oscillator based on a control signal output when controlling the oscillation frequency, and
wherein the controller determines the state of the atomic oscillator based on a control voltage to an oscillation device that oscillates in response to a voltage applied thereto, the control voltage being output when controlling the oscillation frequency.

2. The atomic oscillator according to claim 1, wherein
the controller determines the state of the atomic oscillator based on a control signal to a device installed in the atomic oscillator, the control signal being output when controlling the oscillation frequency.

3. An atomic oscillator comprising:
a gas cell in which alkali metal atoms are encapsulated;
a light generator that irradiates the gas cell with irradiation light having at least two different frequency components;
a light detector that detects transmission light transmitted by the gas cell; and
a controller that determines a resonance frequency of the irradiation light based on a light amount of the detected transmission light and controls an oscillation frequency based on the determined resonance frequency,
wherein the controller determines a state of the atomic oscillator based on a control signal output when controlling the oscillation frequency, and
wherein the controller determines the state of the atomic oscillator in accordance with change of a value based on the control signal.

4. The atomic oscillator according to claim 3, wherein
the controller determines the state of the atomic oscillator in accordance with change of the control signal relative to a past value of the control signal.

5. The atomic oscillator according to claim 3, wherein
the controller determines the state of the atomic oscillator in accordance with change of a statistical value of values of the control signal during a predetermined period of time.

6. A control method for controlling an atomic oscillator, the atomic oscillator including: a gas cell in which alkali metal atoms are encapsulated; a light generator that irradiates the gas cell with irradiation light having at least two different frequency components; a light detector that detects transmission light transmitted by the gas cell; and a controller that determines a resonance frequency of the irradiation light based on a light amount of the detected transmission light and controls an oscillation frequency based on the determined resonance frequency,
the control method comprising:
determining a state of the atomic oscillator based on a control signal output when controlling the oscillation frequency; and
determining the state of the atomic oscillator based on a control voltage to an oscillation device that oscillates in response to a voltage applied thereto, the control voltage being output when controlling the oscillation frequency.

7. The control method according to claim 6, comprising determining the state of the atomic oscillator based on a control signal to a device installed in the atomic oscillator, the control signal being output when controlling the oscillation frequency.

8. The control method according to claim 6, comprising determining the state of the atomic oscillator in accordance with change of a value based on the control signal.

9. The control method according to claim 8, comprising determining the state of the atomic oscillator in accordance with change of the control signal relative to a past value of the control signal.

10. The control method according to claim 8, comprising determining the state of the atomic oscillator in accordance with change of a statistical value of values of the control signal during a predetermined period of time.

* * * * *